United States Patent [19] [11] Patent Number: 4,878,770
Ruggierio et al. [45] Date of Patent: Nov. 7, 1989

[54] IC CHIPS WITH SELF-ALIGNED THIN FILM RESISTORS

[75] Inventors: Paul A. Ruggierio, Littleton, Mass.; Cynthia E. Anderson, Glenview, Ill.

[73] Assignee: Analog Devices, Inc., Norwood, Mass.

[21] Appl. No.: 94,513

[22] Filed: Sep. 9, 1987

[51] Int. Cl.⁴ ............................................. H01C 1/012
[52] U.S. Cl. ................................... 388/308; 338/309; 338/307
[58] Field of Search ............... 338/308, 306, 307, 309, 338/310

[56] References Cited

U.S. PATENT DOCUMENTS 3,862,017 1/1975 Tsunemitsu et al. .................. 205/15
4,020,222 4/1977 Kausche et al. ..................... 428/209
4,139,833 2/1979 Kirsch .................................. 338/308
4,164,607 8/1979 Thiel et al. ....................... 338/308 X
4,414,274 11/1983 Hieber ................................ 428/336

Primary Examiner—C. L. Albritton
Assistant Examiner—M. M. Lateef
Attorney, Agent, or Firm—Parmelee, Bollinger & Bramblett

[57] ABSTRACT

Process of making an IC chip with thin film resistors, and IC chips made by such process, wherein a chip substrate first is covered with layers of thin film and interconnect material (with an intermediate barrier layer if needed), such layers being etched away in predetermined regions in accordance with the metal interconnect pattern, the remaining layered material being aligned vertically, and thereafter, in a section of the remaining material, etching away the interconnect material (and barrier material if used) to expose the thin film material to form a thin film resistor which is self-aligned with the adjoining sections of interconnect conductors. The material in the predetermined regions may be etched by a dry-etch (plasma) or by a wet-etch.

5 Claims, 3 Drawing Sheets

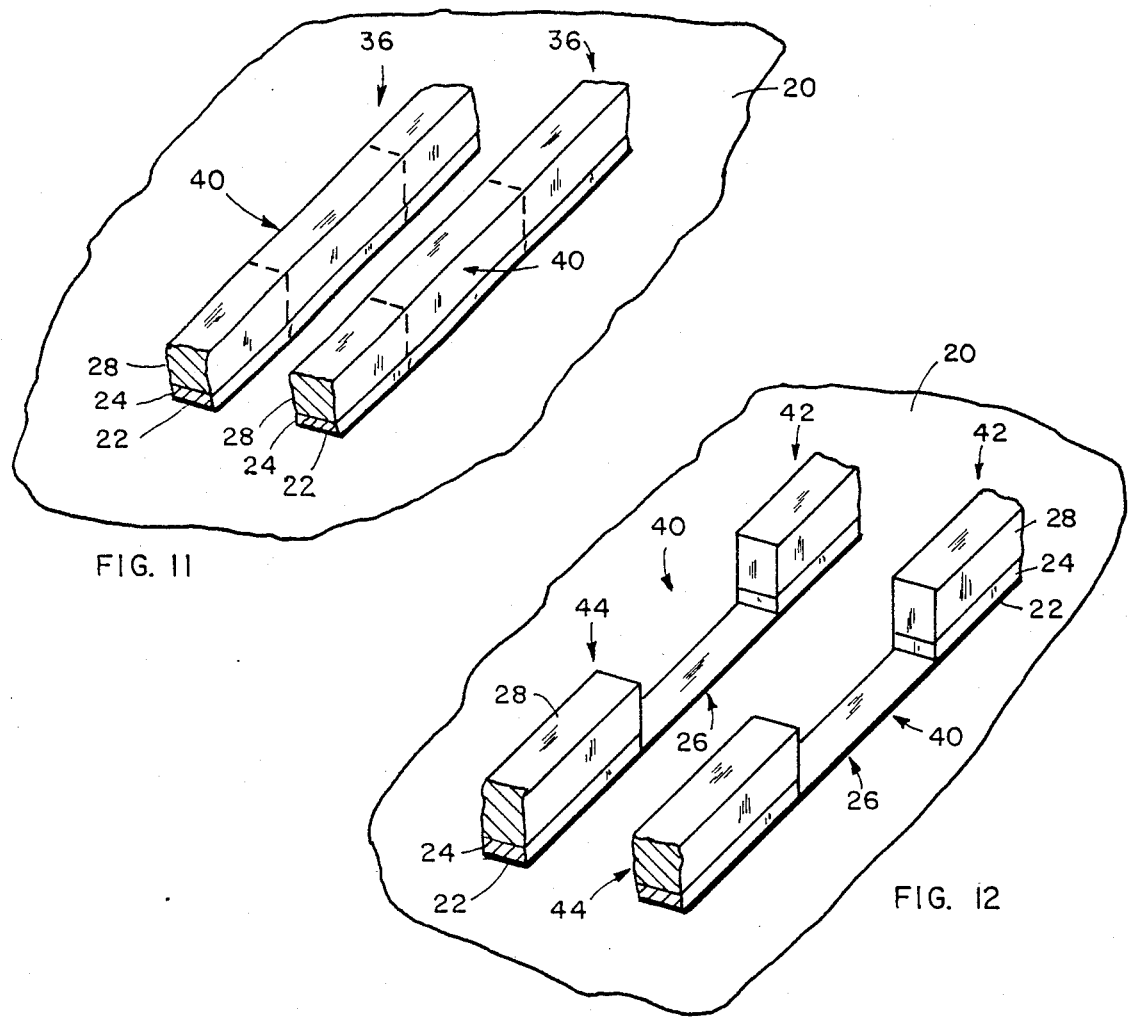
FIG. 11
FIG. 12
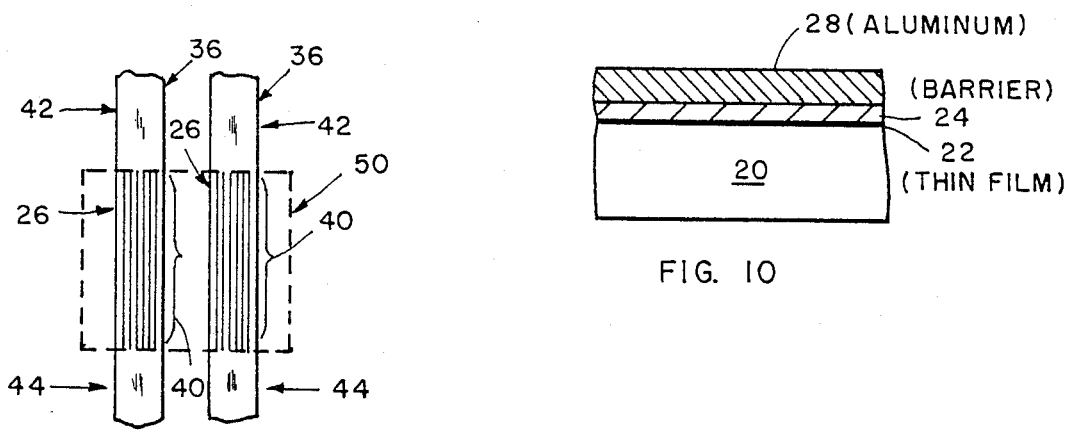
FIG. 13
FIG. 10

IC CHIPS WITH SELF-ALIGNED THIN FILM RESISTORS

BACKGROUND OF THE INVENTION

1. Field of the Invention

This invention relates to integrated-circuit (IC) chips carrying thin film resistors. More particularly, this invention relates to improved techniques for developing thin film resistors on IC chips, and to IC chips made by such improved techniques.

2. Description of the Prior Art

IC chips have been manufactured for many years by various processes. Resistors for the circuits can be formed by diffusions into the substrate, but for many applications the resistors must be formed from thin film material, such as Silicon Chromium (Si Cr), deposited on the substrate. The present invention concerns only thin film resistors.

Interconnect material, usually Aluminum or one of its alloys, is applied by photolithographic procedures to make connections to all circuit elements including thin film resistors. A barrier layer such as Titanium-Tungsten (TiW) may be placed between the thin film material and the Aluminum. The configurations of all of these materials are controllable by conventional photolithographic processes employing photoresist and etching to remove selected portions of a deposited layer.

In one early process, thin film material is deposited over the entire substrate. (Note: normally the substrate is a circular wafer, to be subdivided after processing into separate chips.) The optional barrier layer, if used, is laid down over the layer of thin film material. Photolithography then is employed to etch away all portions of the thin film and barrier layer except selected regions where resistors are to be developed. In those regions, the thin film material (and the optional barrier layer) remaining after the etching serves as the resistors for the circuit on the chip.

The entire substrate then is covered with Aluminum, which thereafter is etched away selectively to establish the interconnect pattern. This pattern includes portions which make contact with the various transistor elements, and other components, and also includes portions making contact with the ends of the thin film resistors developed on the substrate described above.

In an alternative procedure, the substrate receives, in sequence, covering layers of thin film material, barrier layer (if required) and interconnect material (e.g. Aluminum). Next, the interconnect pattern is established by the usual photoresist masking and etching. The barrier layer (if used) then is etched away in the areas where the interconnect had previously been etched away (the barrier material however still remaining under the non-etched interconnect). Thus the thin film material is exposed in the etched areas (i.e. all areas except where the interconnect is established). Photo-resist then is used to mask out the thin film material where resistors are to be formed, and all the other (non-masked) thin film material is etched away, leaving only thin film to serve as resistors.

In both of the above-described techniques, chemical etchant solutions (i.e. so-called "wet-etching") were employed for removal of the interconnect material (Aluminum) in those regions identified by the photolithographic masking. This produces "isotropic" etching, where the etching action takes place equally in all directions. Such etching results in undercuts of the material being etched. Wet-etching is satisfactory for processes using relatively wide conductors, such as 5 microns or larger. However, for smaller-width conductors, and wherein close spacing is required between conductors, it is necessary for the etching to be substantially "anisotropic". Such etching avoids undercutting of the layer being etched, and permits close spacing of the conductors.

Plasma etching (or so-called "dry etching") has been introduced to perform anisotropic etching for Aluminum and its alloys. Plasma etching however also attacks barrier and thin film materials, and cannot be used with the prior processes as described above without injuring the thin film material to be used as resistors.

Accordingly, there has developed a strong need for new processing techniques which can make use of Plasma or dry-etching, to permit use of narrow interconnect conductors, to allow closer spacing of such interconnect conductors, and which yet is compatible with he development of resistors formed from deposited thin film material.

SUMMARY OF THE INVENTION

In a preferred embodiment of the invention, to be described hereinbelow in more detail, the process comprises the steps of depositing on a substrate sequential layers of thin film material, barrier material (if needed), and Aluminum. Next, plasma etching is employed to remove all three layers simultaneously in preselected masked areas. The remaining (non-etched) layers define the interconnect pattern for the IC. Additionally, the remaining layered material comprises sections ("TF sections") where thin film resistors are to be developed. Such TF sections have the same width as the immediately adjacent Aluminum conductors of the interconnect pattern. Wet-etching then is used in each such TF section, in accordance with a thin film opening mask, to remove the barrier and Aluminum layers above the thin film for the resistors, thereby exposing the thin film so that it can serve its function as a resistor.

The ends of each such thin film resistor are in electrical contact with the adjoining portions of the Aluminum interconnect already established by the initial dry etching. It should particularly be noted that those adjoining portions of the Aluminum interconnect are automatically self-aligned to the ends of the thin film resistors since both were etched during the formative steps in accordance with the same mask definition.

The use of plasma-etching (dry-etching) to establish the interconnect pattern in this technique does not injure the thin film resistors to be developed. The conductors of the interconnect, and the thin-film resistors, all can be narrowly defined, with minimal spacing between adjacent conductors, thereby substantially increasing the density of components of an IC chip. This is particularly important for IC chips using double metal layers.

Still other techniques and procedures for achieving the above-described results are described in the following specification.

Accordingly, it is an object of this invention to provide improved processes for producing IC chips with thin film resistors, and to provide IC chips with thin film resistors incorporating improved constructional arrangements. Other objects, aspects and advantages of the invention will be pointed out in, or apparent from, the following description of preferred embodiments, considered together with the following drawings.

BRIEF DESCRIPTION OF THE DRAWINGS

FIGS. 10, 11, 12 and 13 comprise vertical section, perspective, and plan views of portions of an IC chip, to illustrate the significant steps in the new process for developing ICs with thin film resistors.

DETAILED DESCRIPTION OF PREFERRED EMBODIMENTS

Figure 1:
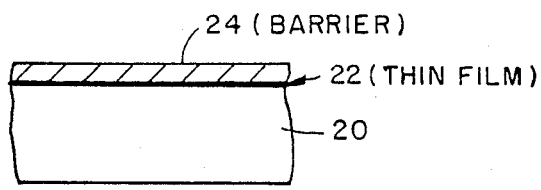
FIGS. 1, 2A, 2B, 3, 4A, and 4B comprise vertical section and plan views of portions of an integrated circuit chip, illustrating one prior art process for developing thin film resistors.

Before describing the present invention in detail, an outline first will be presented of two prior art processes previously used for making ICs with thin film resistors. In the first process, and referring now to FIG. 1, a substrate 20 (e.g. formed of Silicon, and shown in section) first is provided with covering layers of thin film material 22 such as Silicon Chrome (SiCr), and barrier material 24 such as Titanium Tungsten (TiW). A coating of photoresist (not shown) then is laid down over the barrier layer, and the photoresist is exposed through a photolithographic mask to project onto the photoresist the configuration of the thin film resistors. The photoresist then is developed and portions removed in the usual way, to define the shape of the resistors.

Figure 2A:
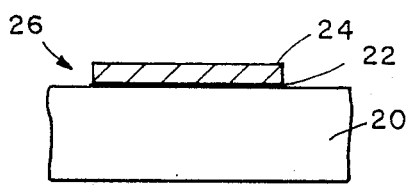
Figure 2B:
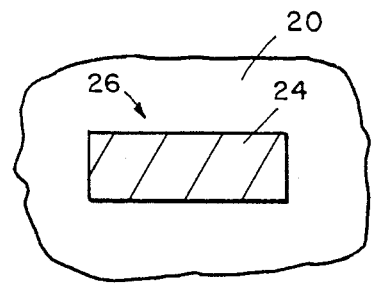

The exposed barrier and thin film layers where the photoresist was removed then are etched by wet-chemical etchant and plasma etchant respectively. For example, the TiW barrier may be etched by $H_2O_2$, and the SiCr thin film by $CF_4+O_2$ (a plasma etchant). The photoresist then is removed, resulting (see FIGS. 2A, 2B) in two-layered segments each including a layer of thin film material 22 covered by a barrier material 24. The barrier-covered thin film material will become the desired thin film resistor 26.

Figure 3:
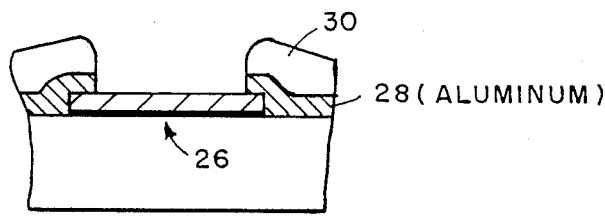
Figure 4A:
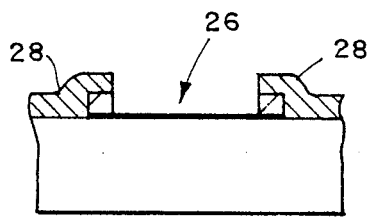
Figure 4B:
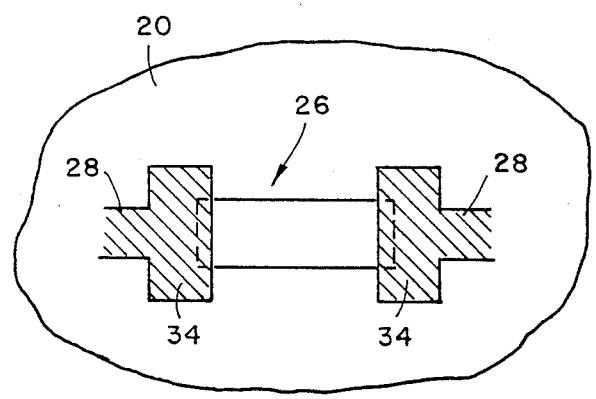

Next, a layer of Aluminum is laid down over the entire area of the substrate, and covered with photoresist. A masking operation follows, to establish the interconnect pattern for the IC. Wet-chemical etchant (such as so-called "PAN" etch) then is applied to remove the delineated portions of Aluminum, leaving the interconnect conductors 28 (FIG. 3) which make contact with the various IC components, including the transistor elements and also including the ends of the thin-film resistors 26. FIG. 3 shows the photoresist 30 still covering the non-etched portions of Aluminum. The barrier layer 24 then is etched away (as by a wet-etchant such as $H_2O_2$) in the regions not covered by the photoresist 30. The photoresist then is removed to complete the IC with thin film resistors 26 as shown in FIGS. 4A and 4B.

Figure 5:
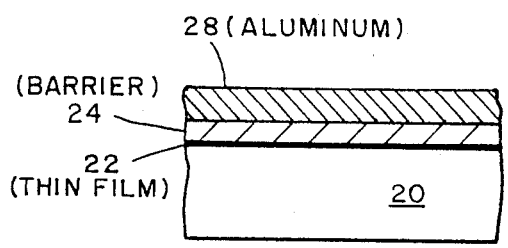
FIGS. 5, 6A, 6B, 7, 8A, 8B and 9 comprise vertical section and plan views of portions of an IC chip illustrating another prior art process for developing thin film resistors.
Figure 6B:
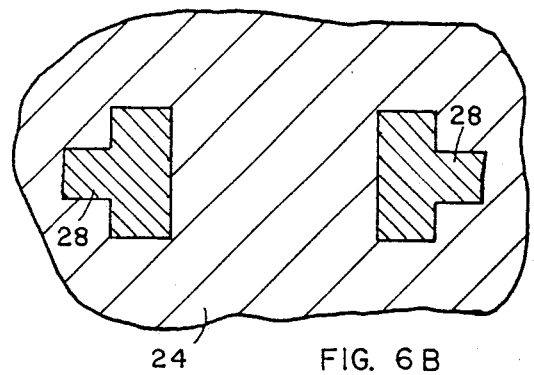
Figure 6A:
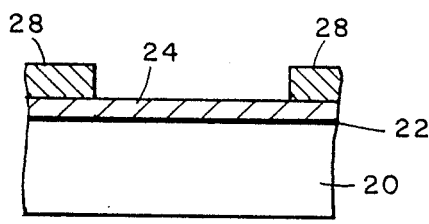
Figure 7:
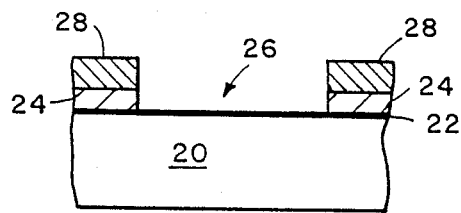

In another prior process (referring now to FIG. 5), the substrate 20 first is covered completely with successive layers of thin film material 22, barrier material 24, and Aluminum 28. Photoresist then is laid down, exposed and developed to define the metal interconnect pattern. Wet-chemical etchant such as "PAN" etch (i.e. Phosphoric, Acetic and Nitric acid) then is applied to remove the non-masked portions of Aluminum (FIGS. 6A and 6B), and another wet-chemical etchant such as $H_2O_2$ removes the corresponding portions of the barrier layer 24 (FIG. 7). Thus, the thin film material 22 is exposed in all regions of the IC except where the Aluminum interconnect pattern exists.

Figure 8B:
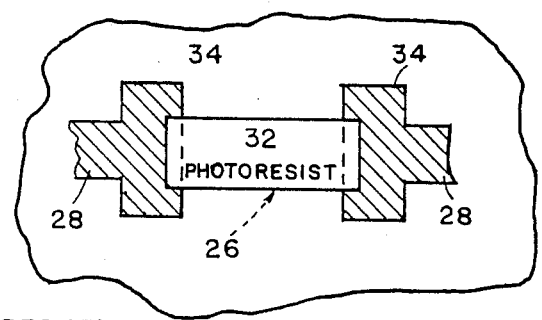
Figure 8A:
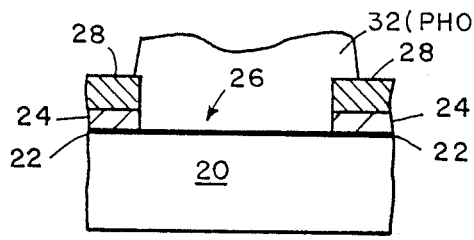
Figure 9:
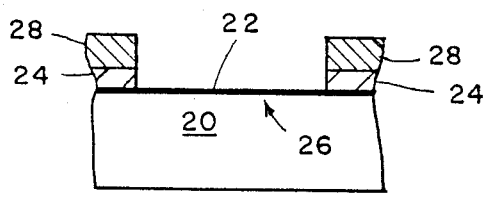

The photoresist used for the Aluminum and barrier etching then is removed and another application of photoresist 32 (FIGS. 8A and 8B) is laid down, exposed and developed to mask out the areas for the thin film resistors. Etchant for thin film material (such as the plasma $CF_4+O_2$) then is applied to remove all portions of the thin film layer except where the resistors are to be (see FIG. 9).

In both of the above prior processes, overlaps must be provided between the thin film resistors 26 and the adjoining sections of the Aluminum interconnect 28. For example, in both FIGS. 4B and 8B, the Aluminum pattern is formed with T-shaped (i.e., laterally-widened) terminals 34. And, as shown in FIG. 4B, both terminals 34 extend over the resistor 26 a significant distance, just as in FIG. 8B the photoresist 32 extends out over the terminals 34 a similar distance. Such overlaps are needed to provide for the tolerances required in the processing steps involved.

As mentioned previously, it is known that plasma etching of the Aluminum interconnect allows use of narrower conductors, thereby achieving higher packing densities. However, such plasma etching is not compatible with prior processes, such as described above, for making ICs with thin film resistors. The present invention provides a solution to this problem, as will now be described, and at the same time effects self-alignment of the interconnect conductors and the thin film resistors which makes possible still further reductions in the spacing between conductors, thus further increasing the packing density.

Referring now to FIG. 10, the substrate 20 is, as in the second prior art process described above, first covered with successive layers of thin film material 22 (such as Silicon Chrome), barrier material 24 (if needed), and interconnect material 28 (such as Aluminum). Photoresist then is laid down, exposed and developed in accordance with the interconnect pattern. Plasma etching ("dry etching") then is employed to remove, simultaneously, all three layers 22, 24, 28 in the non-masked regions, thereby establishing a pattern comprising three-layered segments 36, such as illustrated in FIG. 11. It will be seen that the separate layers are all aligned in a vertical direction. That is, the side edges of the three layers are in a vertical line, perpendicular to the plane of the substrate.

These three-layered segments 36 in part define the metal interconnects for the IC, so as to provide metal connections to the various elements of the circuit (transistors, etc.). In addition, some of the three-layered segments include intermediate sections 40 such as illustrated in FIG. 11 (the ends of which are delineated by dotted lines), incorporating thin film material which ultimately will become thin film resistors. Such sections thus can be referred to as TF sections. It will be clear that the resistor width in such TF sections will necessarily be identical to the width of the Aluminum conductors immediately adjacent to the thin film resistors-to-be.

A further photoresist application then is made, exposed, and developed, to mask out all regions of the three-layered segments 36 except for the intermediate TF sections 40. Wet-chemical etchant then is used to remove the two upper layers 24, 28 of these intermediate sections, leaving (as shown in FIG. 12) the thin film material 22, and adjoining sections 42, 44 of the original three-layered segments.

FIG. 13 illustrates how the photolithographic mask is employed to outline the material to be removed from two intermediate sections 40. Here, the thin film opening mask defines a zone 50 over both segments 36, covering the sections completely in a transverse direction, and extending a predetermined distance longitudinally. When the photoresist is removed from the zone 50, the intermediate sections 40 thereof are exposed to the action of the wet-chemical etchant (such as PAN etch, followed by $H_2O_2$). This etchant removes the barrier material 24 and the Aluminum 28, leaving the thin film material 22 in the regions covered by the mask zone 50 to serve as thin film resistors 26.

As a result of these process steps, the IC is left with spaced-apart sections 42, 44 each having therebeneath a layer of thin film material 22 (FIG. 12) which is aligned with the interconnect metal 28 at the top of the section, and which makes electrical contact therewith. Between the two spaced-apart sections is a strip of additional thin film 22, serving as the thin film resistor 26. This resistor material is of course integral with the thin film beneath the metal interconnect, and has the same width and thickness. In the arrangement shown, the sections 42 and 44 are generally elongate in the direction towards the gap between the sections, and the resistor material in the gap also is elongate in that direction so as to be aligned in a horizontal plane with the thin film at the bottom layer of the sections 42, 44. The side edges of the material of the resistor 26 are aligned longitudinally with the corresponding side edges of the adjacent spacedapart sections 42, 44. The thin film material 22 thus forms a geometric shape which is generally rectangular (except that the short sides are indefinite, as indicated).

It will be seen that the exposed thin film resistors 26 are automatically aligned (i.e. "self-aligned") with the adjoining sections of interconnect conductors 28, due to the fact that they were both originally etched to the same side walls. It also will be understood that errors in positioning of the mask defining the zone 50 have no deleterious consequences. That is, normal lateral (side-by-side) variations clearly have no effect, and vertical (longitudinal) variations merely change the start and ending locations for the thin film resistors 26 without, however, changing the length of the resistors. By defining the length of the resistor in a separate masking and etching process, there is no effect on the width of the resistors which thus can be tightly controlled.

Simultaneous etching of the three layers 22, 24, 28 can with advantage be carried out with chlorinated gases in plasma. For example, good results can be achieved with $C Cl_4 + Cl$ (Carbon tetrachloride plus Chlorine), or with $B Cl_3 + Cl$ (Boron trichloride and Chlorine). The interconnect material 28 can be an Aluminum alloy such as Aluminum-Copper, Aluminum-Silicon, or Aluminum- Copper-Silicon. The percentage weight of Copper can be within a relatively wide range, e.g. from 0.1 to 4.0 percent. The Silicon content can also vary, e.g. from 0.1 to 1.5 per cent by weight.

The self-alignment feature described above can be achieved while using wet-etch as well as with dry-etch. In such a process, the substrate would first be covered in its entirety by the three layers (thin film, barrier, and Aluminum), just as in the dry-etch process. This is followed, as before, by application of photoresist which is exposed and developed to form the image for the metal interconnect. Then, instead of dry-etch to remove all three layers simultaneously, wet-etch plus dry-etch can be used to remove the layers in sequence. For example, PAN etch can be used for the Aluminum, $H_2O_2$ for a TiW barrier layer and $CF_4+O_2$ used for Silicon Chrome thin film. The remainder of the process could be as previously described.

Although specific preferred embodiments of the invention have been described hereinabove in detail, it is desired to emphasize that this is for the purpose of illustrating the principles of the invention, and should not be considered as necessarily limiting of the invention, it being understood that those skilled in this art can make many modifications to the described techniques without departing from the scope of the invention.

What is claimed is:

1. An IC chip comprising:
   a substrate for carrying IC components including transistor elements;
   metal interconnect having side edges and formed above said substrate in a pattern to make connections to said elements of the IC;
   said pattern comprising at least two spaced-apart portions of metal interconnect having ends separated by a gap;
   a layer of thin film above said substrate and beneath said metal interconnect in all portions thereof and making electrical contact therewith, said thin film layer having side edges aligned vertically with the side edges of said metal interconnect and forming layered segments; and
   a layer of additional thin film material in said gap between said spaced-apart portions of metal interconnect, said additional thin film material being integral with the thin film material beneath said spaced-apart portions and having the same width and thickness as the thin film beneath said spaced-apart portions, said additional thin film material serving as at least one resistor for the circuit of said IC chip.

2. An IC chip as in claim 1, wherein said spaced-apart portions and the thin film therebeneath are elongate in the direction towards said gap, said additional thin film material extending directly between said spaced-apart portions so as to be aligned in a horizontal plane with the material beneath said spaced-apart portions.

3. An IC chip as in claim 1, wherein the side edges of said additional thin film material are aligned longitudinally with the corresponding side edges of said spaced-apart portion.

4. An IC chip as in claim 1, including a layer of barrier material between said metal interconnect and the thin film material therebeneath, said barrier material having side edges aligned vertically with the side edges of said metal interconnect and the thin film material therebeneath.

5. An IC chip as in claim 1, wherein the thin film material beneath said interconnect portions and in said gap together form a geometric shape having straight side edges.

* * * * *